3,266,961

METHOD OF ETCHING Si AND Ge SEMICONDUCTOR BODIES

Reimer Emeis, Ebermannstadt, Germany, assignor to Siemens-Schuckertwerke Aktiengesellschaft, Erlangen, Germany, a corporation of Germany No Drawing. Filed Jan. 23, 1962, Ser. No. 168,269
Claims priority, application Germany, Feb. 3, 1961, S 72,354
4 Claims. (Cl. 156—17)

My invention relates to an etching method in the production of crystalline or substantially monocrystalline semiconductor bodies to be used as rectifiers, transistors, photo-diodes, four-layer junction components, and other electronic devices.

The etching process, to which semiconductor bodies for use in such devices are subjected, serves mainly to remove impurities which may adhere to the surface, and to eliminate irregularities from the semiconductor surface per se. The particular etching liquid being used depends upon the particular semiconductor material to be treated. The semiconductor material may, for example, consist of germanium, silicon, or such intermetallic compounds of elements from the third and fifth groups, such as indium antimonide, indium arsenide, gallium phosphide and gallium arsenide, or from the second and sixth groups of the periodic systems, such as cadmium telluride. Hot potassium hydroxide is among the etching liquids used for such purposes. The etching action of most known etching liquids is extremely vigorous. After a very short interval of treatment, in most cases after a few seconds, the etching operation must be discontinued to prevent the occurrence of uncontrollable etching attacks.

According to my invention, which is particularly applicable for the etching of substantially monocrystalline semiconductors, the semiconductors, after mechanical fabrication, are subjected to an alkaline etching liquid before being further fabricated in the production of electronic semiconductor devices. The above etching treatment is performed by subjecting the semiconductor bodies to slow etching in potassium or sodium hydroxide at room temperature for a period between 10 and 30 hours. Highly concentrated potassium hydroxide is the preferred etchant.

Further details as well as the advantages of the invention are described with reference to an example. For certain electronic semiconductor devices, e.g. rectifiers and transistors, semiconductor bodies are preferably in the shape of circular discs. Such discs are prepared for example by first producing the semiconductor rod which is given a suitable diameter, for example by crucible-free zone melting. The rod is then cut into slices extending perpendicular to the rod axis. These slices have a diameter of 10 to 30 mm. and a thickness of 200 to 400 microns, depending upon the particular purpose to which the finished discs are to be placed. By subjecting the slices to a lapping operation, the semiconductor discs are then given the desired thickness, for example 150 to 300 microns, and simultaneously the two flat sides of the semiconductor discs are made planar and perfectly parallel to each other. The semiconductor discs are thereafter etched in order to eliminate those surface layers that have become disturbed by the sawing and lapping operations. Certain zones of the semiconductor discs can thereafter be doped with donor or acceptor substances by alloying or diffusing these substances in the semiconductor materials.

It is known to use hot potassium hydroxide (50 to 100° C.) for performing the above-mentioned etching operation. Hot potassium hydroxide is capable of completely dissolving such substances as silicon and germanium. Consequently the etching treatment must be discontinued after a very short interval of time, for example a few seconds, and this interval of time must be very accurately maintained if the etching is to result in eliminating a layer of a prescribed thickness. Another disadvantage of the known etching methods is that the semiconductor discs have the tendency to assume a slightly lens shape configuration because the attack of the etching agent is more vigorous at the edge of the disc than in the middle. This results from the particular flow conditions during etching resulting from the tearing-off of the evolving gas bubbles. The same disadvantages are encountered with other known etching liquids, such as the known CP-etching solution (Chemical Polish) consisting of a mixture of 40% hydrofluoric acid and fuming nitric acid in a 1:1 ratio.

The method according to the invention has greatly improved results. It has been found, for example, that silicon discs, when placed into concentrated potassium hydroxide (250 g. KOH per 300 g. $H_2O$) at room temperature for approximately 24 hours' etching treatment, were completely free of surface layers disturbed by mechanical machining, without any impairment of the planar parallelism of the flat sides. Observation has shown that the disturbed layers, which had a thickness of about 5 to 10 microns, were eliminated preferentially and that thereafter the etching attack was very greatly slowed down. Consequently, a variation of a few hours of the etching treatment are irrelevant; after eliminating the disturbed crystal layer, the etching attack is virtually at standstill. It has further been observed that the semiconductor discs, if placed loosely into the etching liquid, will slowly roll and glide about under the action of the evolving gas bubbles, particularly at the beginning of the etching treatment, and that this causes the elimination of material to take place very uniformly over the entire width of the discs from the middle to the edge.

The method can be modified in various respects. Thus, the same difficulties are encountered not only with circular semiconductor discs, but also with semiconductors of different shapes, for example in the shape of cubes. Germanium and other semiconductor materials can be etched in exactly the same manner. In lieu of potassium hydroxide, sodium hydroxide is also applicable. The latter exhibits a somewhat slower etching attack. The potassium or sodium hydroxide is preferably used at a temperature between 10 and 40° C. At very low temperatures, the etching attack is slowed down to such an extent that the economy of the process is impaired. At higher temperatures, a complete dissolution of the semiconductor material or an etching attack down to uncontrollable depth may occur.

Obviously many modifications and variations of the present invention are possible in the light of the above teachings. It is therefore to be understood that within the scope of the appended claims, the invention may be practiced otherwise than as specifically described.

I claim:

1. The method of etching substantially monocrystalline semiconductor bodies selected from the group consisting of silicon and germanium after lapping, which comprises immersing said semiconductor bodies in an etching solution of concentrated potassium hydroxide solution, at room temperature, for a period of about 24 hours resulting in maintaining the planes of the flat sides in planar parallel relationship.

2. The method of etching substantially monocrystalline semiconductor bodies selected from the group consisting of silicon and germanium after lapping, which comprises immersing said semiconductor bodies in a vessel containing a concentrated aqueous solution of an etchant selected from the group consisting of potassium hydroxide and sodium hydroxide, at temperatures from about 10° to 40° C., for a period between 10 and 30 hours resulting in maintaining the planes of the flat sides in planar parallel relationship.

3. The method of etching substantially monocrystalline silicon semiconductor bodies after lapping, which comprises immersing silicon semiconductor bodies in an etching medium of a concentrated aqueous solution of an etchant selected from the group consisting of potassium hydroxide and sodium hydroxide, at a temperature between 10° and 40° C., for a period of at least 10 hours resulting in maintaining the planes of the flat sides in planar parallel relationship.

4. The method of etching substantially monocrystalline germanium semiconductor bodies after lapping, which comprises immersing germanium semiconductor bodies in an etching medium of a concentrated aqueous solution of an etchant selected from the group consisting of potassium hydroxide and sodium hydroxide, at a temperature between 10° and 40° C., for a period of at least 10 hours resulting in maintaining the planes of the flat sides in planar parallel relationship.

References Cited by the Examiner

UNITED STATES PATENTS

| | | | |
|---|---|---|---|
| 2,588,008 | 3/1952 | Jones et al. ------ | 156—17 XR |
| 2,809,103 | 10/1957 | Alexander ----------- | 156—17 |
| 3,041,226 | 6/1962 | Pennington ---------- | 156—17 |
| 3,082,136 | 3/1963 | Finn ---------------- | 156—17 |

OTHER REFERENCES

Solid State Abstract Card No. 3315 M5.3.3.3.1.4.1, Silicon Light Figures by Pennington and Turner (Hughes Aircraft), J. Electrochemical, vol. 105, p. 252C(A), December 1958.

ALEXANDER WYMAN, *Primary Examiner.*

JACOB STEINBERG, *Examiner.*